United States Patent [19]

Paulson et al.

[11] Patent Number: 5,100,764
[45] Date of Patent: Mar. 31, 1992

[54] METHOD OF MAKING PATTERNED METAL OXIDE FILMS COMPRISING A SOL-GEL OF METAL OXIDE AND A PHOTOACTIVE COMPOUND

[75] Inventors: Bradley A. Paulson; Allen R. Landin, both of Ames, Iowa

[73] Assignee: Iowa State University Research Foundation, Inc., Ames, Iowa

[21] Appl. No.: 456,482

[22] Filed: Dec. 26, 1989

[51] Int. Cl.$^5$ .......................... G03F 7/32; G03F 7/40; B05D 1/32

[52] U.S. Cl. .................................. 430/311; 430/326; 430/330; 430/165; 428/901; 427/126.3; 427/272

[58] Field of Search ............... 430/331, 311, 325, 330, 430/165, 166, 326; 428/901; 427/126.3, 272

[56] References Cited

U.S. PATENT DOCUMENTS

| | | | |
|---|---|---|---|
| 4,535,054 | 8/1985 | Brault et al. | 430/325 |
| 4,617,206 | 10/1986 | Haisma et al. | 427/374.1 |
| 4,652,463 | 3/1987 | Peters | 427/53.1 |
| 4,656,455 | 4/1987 | Tanino et al. | 338/35 |
| 4,690,831 | 9/1987 | Uken et al. | 427/44 |
| 4,704,299 | 11/1987 | Wielonski et al. | 427/38 |
| 4,738,869 | 4/1988 | Baumgartner | 427/54.1 |
| 4,749,436 | 6/1988 | Minato et al. | 156/345 |
| 4,752,501 | 6/1988 | Hicks et al. | 427/126.3 |
| 4,753,856 | 6/1988 | Haluska et al. | 428/698 |
| 4,931,312 | 6/1990 | de Leeuw et al. | 427/248.1 |
| 4,946,710 | 8/1990 | Miller et al. | 427/376.2 |

FOREIGN PATENT DOCUMENTS

| | | |
|---|---|---|
| 54-20658 | 7/1979 | Japan . |
| 55-152573 | 11/1980 | Japan . |
| 57-17481 | 1/1982 | Japan . |
| 60939 | 1/1985 | Japan . |
| 61-265822 | 11/1986 | Japan . |

Primary Examiner—Charles L. Bowers, Jr.
Assistant Examiner—John S. Chu
Attorney, Agent, or Firm—Zarley, McKee, Thomte, Voorhees & Sease

[57] ABSTRACT

A method of making patterned metal oxide films on microelectronic wafer substrates. They are prepared by making a sol-gel of a metal oxide in combination with an ultraviolet light sensitive photo-active compound. The sol-gel is applied to a silicon wafer substrate, and the wafer subjected to a predetermined pattern of ultraviolet light to cause the photo-active compound to respond to the ultraviolet light. The wafer is thereafter aqueous alkali metal hydroxide washed to wash away the portions of the metal alkoxide film which have been exposed to UV light.

17 Claims, No Drawings

METHOD OF MAKING PATTERNED METAL OXIDE FILMS COMPRISING A SOL-GEL OF METAL OXIDE AND A PHOTOACTIVE COMPOUND

BACKGROUND OF THE INVENTION

This invention relates to microelectronic circuit substrates of high integrity. Generally, these devices are produced by repetition of a number of processes such as formation of an insulating film on the surface of a semiconductor wafer, followed by etching of the film. For example, in the case of an insulating film formed on a silicon wafer, the etching includes a photolithographic process for forming a minute photo-resist pattern on the insulating film, followed by a wet etching process or a dry etching of the film, where the photo-resist pattern serves as a mask.

It is not uncommon for the photo-resist pattern formed by the photolithography to be insufficient of resistance to heat, or for it to deform if subjected directly to plasma, both of which may result in difficulty in achieving a proper minute etching.

In preparing thin films on for example silicon wafers for use in microelectronic circuitry, one possible technique for application of the thin film is via colloidal suspensions, i.e. sol-gels. This is a preferred method of deposit since there is no need for complicated, costly equipment and since the deposition rates and the stoichiometries can often be difficult to control in alternative methods of film production. A wide variety of materials can be produced by the sol-gel process, including oxides of titanium, vanadium, chromium, iron, cobalt, nickel, germanium, yttrium, zirconium, niobium, indium, tin, tantalum, lead, and even some rare earth elements. Thus, sol-gel derived crystalline films are very attractive to the electronics industry for use as conformal, insulating, or encapsulating layers in circuitry.

However, while several of the metal oxides are of interest as coatings, it would be advantageous to be able to use many of these materials as more than just conformal or encapsulating layers in electronic circuitry. However, in order to incorporate films into electronic devices, the films must be patterned.

In the past it has been known that gel films are not as hard and resistant to etching as the corresponding ceramic films. It would therefore be of a significant advantage, particularly in microelectronics, if sol-gel derived films could be patterned prior to the calcination of the gel to the polycrystalline ceramic.

It is therefore a primary objective of the present invention to devise a method where sol-gel deposited films can be patterned in a cost effective manner such that the film can be effectively used in microelectronic circuitry.

Another objective of the present invention is to provide a method of sol-gel film deposit patterning of metal oxide films in such a manner that the film's integrity is preserved without breaks, pinholes, etc.

Another objective of the present invention is to provide a sol-gel film deposited on a silicon wafer which is patterned, which has good integrity, and which can be densified and used in electronic devices.

The method and manner of accomplishing each of the above objectives will become apparent from the detailed description of the invention which follows hereinafter.

SUMMARY OF THE INVENTION

To achieve the objects of the present invention, a sol-gel of a metal oxide containing a photo-active compound is prepared and applied in a thin film to a wafer substrate. The wafer is dried, and thereafter subjected to a predetermined pattern of ultraviolet light to cause the photo-active compound to respond to the ultraviolet light. Thereafter, the ultraviolet light treated wafer is dipped in aqueous alkali metal hydroxide to wash away those portions of the metal oxide film which have been exposed to ultraviolet light, leaving behind a patterned gel coated wafer. The wafer may be calcined or fired to provide the final patterned ceramic film.

DETAILED DESCRIPTION OF THE INVENTION

The process of the invention begins with a conventional wafer. The wafer can be a silicon wafer or it can be Gallium arsenide or sapphire. The wafer is deposited with a metal oxide film of metals such as those previously mentioned herein. The depositing technique involves sol-gel technology. Sol-gels lead to homogeneous compositions, small particle sizes, and reduce the required processing temperatures. Generally, in the process a colloidal suspension is made of the metal oxide and is coated on the wafer and then caused to coalesce to a uniform homogeneous film or coating. Sol-gel technology is generally known. See for example MacKenzie, J. D. (1984), Applications of Sol-Gel Methods For Glass And Ceramics Processing, pp. 15-26 in Larry L. Hench and Donald R. Ulrich, eds., Ultrastructure Processing of Ceramics, Glasses, and Composites, John Wiley & Sons, Inc., New York, N.Y.; Ostwald, Wolfgang (1922), An Introduction to Theoretical And Applied Colloid Chemistry: The World of Neglected Dimensions, John Wiley & Sons, Inc., New York, N.Y.; Wenzel, Jack (1985), Sol-Gel Technology In the Glass Industry, pp. 224-231 in A. F. Wright and J. Dupuy, eds. Glass . . . current issues, Martinus Nijhoff Publishers, Dordrecht, Netherlands.

Generally speaking, in sol-gel technology a metal alkoxide is hydrolyzed in an alcohol to make a metal oxide. Suitable alcohols include ethyl alcohol, methyl alcohol, propyl alcohol, isopropyl alcohol, and generally $C_1$ to $C_3$ alcohols and alkoxy alcohols. Especially suitable for this invention is 2-methoxyethanol. Often it is desirable to use very small, catalytic amounts of nitric acid to achieve the condensation of the hydrolysis product to form a colloidal suspension, or sol-gel. Satisfactory sol-gels are prepared where the weight basis of metal oxide to alcohol is within the range of from 1:4 to 1:40, preferably 1:8 to 1:16. The amount of nitric acid used as a catalyst where one is employed should preferably be from 550 ppm to 2000 ppm, but can be within the broader range of 150 ppm to 14,000 ppm.

In accordance with the process of the present invention, the sol-gel is prepared by also adding as a sol-gel ingredient an ultraviolet light sensitive photo-active compound. It can be added directly in a one-step preparation in making the sol-gel, or the metal alkoxide can first be hydrolyzed in the alcohol, followed by dissolving of the photo-active compound in the same alcohol and thereafter mixing the two. Generally speaking, the amount of photo-active compound in comparison to the metal oxide should be within the range of from 1:1 to 4.5:1, preferably from 2.5:1 to 3.0:1.

Suitable photo-active compounds are those which provide sensitivity to ultraviolet light and fall within the class of diazoquinones. The preferred diazoquinone is 1-napthalenesulfonic acid, 6-diazo-5,6-dihydro-5-oxo-4-benzoyl-1,2,3 benzene triyl ester.

Ultraviolet light sensitive photo-active compounds are known, see for example earlier referred to text Silicon Processing For the VLSI ERA, at page 418. These compounds are commercially available mixed with low molecular weight novolac resins (as positive photoresist). Generally, the diazonaphthoquinones when exposed to UV light undergo a sequence of photochemical transformations of the diazoquinone sensitizer. This includes decomposition to release nitrogen, followed by a Wolf rearrangement to a ketene, which upon exposure to water provides a base soluble photo-product having a carboxylic acid moiety. As a result, after exposure to the ultraviolet light, relatively dilute aqueous solutions of base will allow the photo-active compound, or more accurately the hydrolysis product therefrom, to be washed out.

In accordance with the process of this invention, after the sol-gel containing the photo-active compound is prepared, the silicon wafer is then coated. Coating can be by a variety of known techniques and can include spraying, spinning, and dipping. Since the film formation is a result of fluid flow across the substrate, thicker, more viscous liquids can require an applied force to obtain the required flow. This was accomplished both by spinning and dipping the substrate. The thickness of films obtained in either manner depends on the viscosity of the fluid and the force applied to spread the fluid.

Initially, films were obtained by applying the sol to the static substrate and allowing it to flow across the wafer surface. Thinner films were obtained by tipping the wafer on edge and letting the excess sol flow off the substrate. After several minutes, the sol had dried enough for the films to set.

In the second film forming method, a Headway Research photo-resist spinner was used to spin some of the films. After applying the sol to the static substrate, the wafers were spun at a preset velocities for thirty seconds. The radial force produces films with uniform thickness across the wafer. For a constant viscosity, the thickness of the film is determined by the rotation speed of the photo-resist spinner; slowing the rotation leads to a thicker film, while increasing the speed of rotation leads to thinner films. After thirty seconds, the films were dry.

Once the films are applied to for example, the silicon wafers, they must then be gently dried. The drying process can be effectively accomplished in oven drying at temperatures within the range of 80° C. to 120° C., preferably within the range of 90° C. to 110° C., and most preferably oven drying at 95° C.

Thereafter, the coated wafer is ready for patterning in the following manner. The wafer, which has a gel coating containing the photo-active compound, is subjected to a predetermined pattern of ultraviolet light. Photolysis can be accomplished by exposing the film to a test pattern, for example for from ten to twenty seconds under ultraviolet light on a mask aligner. The mask masks portions of the wafer so that they will not be subjected to ultraviolet light, leaving some portions unmasked so that they will be subjected to ultraviolet light. Those portions that are subjected to ultraviolet light result in the photo-active compound undergoing the previously described decomposition to an alkaline hydroxide wash-soluble compound.

Next, washing of the film in an aqueous solution of an alkali hydroxide dissolves the decomposed photo-active compound, disrupts the gel network, and leads to dispersion of the areas of the gel film that have been exposed. The aqueous alkali hydroxide should have a concentration within the range of from about 5% to about 15%, and may be sodium hydroxide or potassium hydroxide, but preferably is potassium hydroxide. The preferred concentration is about 10%. The wash can be accomplished by simply dipping the wafer in the solution for from about 10 seconds to about 30 seconds. Care should be taken on the timing of the dip, and one should avoid leaving the wafer exposed to the hydroxide for too long, else the integrity of the coating may be disrupted, causing the initiation of pinholes in the unexposed regions. Concentrations of 20 weight percent of aqueous hydroxide in every instance etched so rapidly that the entire coating was etched off in a matter of seconds. Thus, concentrations above 15% should generally be avoided.

After the soluble material has been removed, the wafer is then ready for firing, generally at temperatures within the range of 600° C. to 1000° C. for from 5 minutes to 24 hours, generally about 1 hour. This sinters the ceramic. A preferred firing temperature is about 700° C.

The wafers, now coated with a metal oxide ceramic in any predetermined and desired pattern, are ready for use in a variety of microelectronic uses. For example, they can be used in resistors, in piezoelectric, filtered devices, dielectrics, semiconductor elements, etc.

The following example is offered to further illustrate but not limit the process of preparing the sol-gel deposited photolytically patterned titanium dioxide gel films.

EXAMPLE

The titanium dioxide sol is produced by adding a dilute solution of nitric acid (0.03 moles $HNO_3$/mole Ti) and water (2.0 moles $H_2O$/mole Ti) in 2-methoxyethanol (4 ml MeOEtOH/g Ti(OPr$^i$)$_4$) to rapidly stirred titanium (IV) isopropoxide. The titanium isopropoxide is readily hydrolyzed to produce titanium hydroxide. The nitric acid catalyzes the condensation of the titanium hydroxide to form a three dimensional network of titanium oxide chains. This sol is then mixed with a solution of the PAC (1-naphthalenesulfonic acid, 6-diazo-5,6-dihydro-5-oxo-4-benzoyl-1,2,3 benzene triyl ester, or simply, triester), (obtained from Shipley Company, Inc.) in 2-methoxyethanol (1 g PAC/g Ti (OPr$^i$)$_4$ and 2.4 ml MEOEtOH/g PAC). The resulting viscous sol was applied to a substrate to obtain a photosensitive gel film.

Once the titania sol and PAC solution are mixed, two milliliters of the resulting fluid were dispensed on polished silicon wafers.

The film was applied to a silicon wafer by pipetting it onto the wafer, allowing it to flow across the wafer surface, and then spinning the wafer for about 30 seconds with the radial force, causing the film to spread in uniform thickness across the wafer.

Thereafter, the wafers were dried in an oven at 95° C. Photolysis was accomplished by exposing the film to a test pattern for 9 seconds under ultraviolet light on a Hybrid Technology Group mask aligner. Thereafter, the wafer was washed in an aqueous solution of 10% potassium hydroxide by dipping the wafer in the solution for about 10 seconds, with the result being that the decomposed photo-active compound disrupted the gel network, leading to dispersion of the areas of the gel film that had been exposed, and leaving behind a pattern of coated undisturbed titanium dioxide on the wafer.

Once the gel had been patterned in a mild bath of aqueous potassium hydroxide, a relatively low calcination temperature, i.e. about 700° C. produced polycrystalline ceramic films with the desired predetermined pattern.

What is claimed is:

1. A method of making patterned metal oxide films on microelectronic wafer substrates, comprising:
   (a) preparing a sol-gel of a metal oxide containing a small but effective amount of an ultraviolet light sensitive photo-active compound;
   (b) applying the thin film of said sol-gel to a wafer substrate;
   (c) drying the coated wafer;
   (d) subjecting the wafer to a predetermined pattern of ultraviolet light to cause said photo-active compound to respond to said ultraviolet light;
   (e) treating the wafer with aqueous alkali metal hydroxide to wash away those portions of the metal alkoxide film which has been exposed to ultraviolet light; and thereafter
   (f) sintering the gel film to form a ceramic film.

2. A method of making patterned metal oxide films on microelectronic wafer substrates, comprising:
   (a) preparing a sol-gel of a metal oxide containing a small but effective amount of the ultraviolet light sensitive photo-active compound, which is 1-naphthalenesulfonic acid, 6-diazo-5, 6-dihydro-5-oxo-4-benzoyl-1,2,3 benzene triyl ester,
   (b) applying the thin film of said sol-gel to a wafer substrate;
   (c) drying the coated wafer;
   (d) subjecting the wafer to a predetermined pattern of ultraviolet light to cause said photo-active compound to respond to said ultraviolet light;
   (e) treating the wafer with aqueous alkali metal hydroxide to wash away those portions of the metal alkoxide film which has been exposed to ultraviolet light; and thereafter
   (f) sintering the gel film to form ceramic film.

3. The method of claim 1 wherein the metal oxide is selected from the group consisting of oxides of aluminum, silicon, tungsten, titanium, vanadium, chromium, iron, cobalt, nickel, germanium, yttrium, zirconium, niobium, indium, tin, antimony, tantalum, and lead.

4. The method of claim 1 wherein the sol-gel includes an alcohol solvent.

5. The method of claim 3 wherein the alcohol solvent is selected from the group consisting of $C_1$ to $C_3$ alcohols and alkoxy alcohols.

6. The method of claim 1 wherein the photo-active compound is a diazoquinone.

7. The method of claim 1 wherein the weight ratio of photo-active compound to metal oxide is within the range of 1:1 to 4.5:1.

8. The method of claim 1 wherein an additional step comprises calcining the wafer to provide the patterned, ready-to-use wafer.

9. The method of claim 1 wherein the drying of the coated wafer is oven drying.

10. The method of claim 9 wherein the drying is at a temperature within the range of 80° C. to 120° C.

11. The method of claim 10 wherein the drying is at a temperature within the range of 90° C. to 110° C.

12. The method of claim 1 wherein the aqueous metal hydroxide has a concentration within the range of about 5% by weight to about 15% by weight.

13. The method of claim 12 wherein the weight basis concentration of the aqueous metal hydroxide is about 10%.

14. The method of claim 13 wherein the alkali metal hydroxide is potassium hydroxide.

15. The method of claim 12 wherein the wafer is treated with said aqueous hydroxide by dipping said wafer in said solution.

16. The method of claim 15 wherein said treating is for from about 10 seconds to about 30 seconds.

17. The method of claim 1 wherein said metal is titanium.

* * * * *